United States Patent [19]
Otoshi et al.

[11] Patent Number: 5,637,358
[45] Date of Patent: Jun. 10, 1997

[54] MICROWAVE PLASMA CHEMICAL VAPOR DEPOSITION PROCESS USING A MICROWAVE WINDOW AND MOVABLE, DIELECTRIC SHEET

[75] Inventors: Hirokazu Otoshi; Keishi Saitoh, both of Nagahama; Ryuji Okamura, Shiga-ken; Koichi Matsuda, Nagahama, all of Japan

[73] Assignee: Canon Kabushiki Kaisha, Tokyo, Japan

[21] Appl. No.: 376,652

[22] Filed: Jan. 20, 1995

Related U.S. Application Data

[63] Continuation of Ser. No. 240,390, May 10, 1994, abandoned, which is a continuation of Ser. No. 994,472, Dec. 21, 1992, abandoned, which is a continuation of Ser. No. 729,873, Jul. 11, 1991, abandoned, which is a continuation of Ser. No. 458,364, Dec. 28, 1989, abandoned.

[30] Foreign Application Priority Data

Dec. 28, 1988 [JP] Japan .................... 63-329311

[51] Int. Cl.⁶ .................................. C23C 16/00
[52] U.S. Cl. .................... 427/575; 118/723 ME
[58] Field of Search ................ 118/723 ME; 501/3; 427/575

[56] References Cited

U.S. PATENT DOCUMENTS

| | | | |
|---|---|---|---|
| 4,265,932 | 5/1981 | Peters | 427/53.1 |
| 4,339,540 | 7/1982 | Beall | 501/3 |
| 4,785,763 | 11/1988 | Saitoh | 118/723 |
| 5,030,476 | 7/1991 | Okamura et al. | 427/39 |

FOREIGN PATENT DOCUMENTS

| | | |
|---|---|---|
| 1245183 | 11/1988 | Canada . |
| 60-186849 | 9/1985 | Japan . |

OTHER PUBLICATIONS

Kato, et al. "High–Rate Deposition of a–Si:H Using Electron Cyclotron Resonance Plasma," Journal of Non–Crystalline Solids 77 & 78 (1985 pp. 813–816).

Webster's New Collegiate Dictionary © 1975, G & C Merriam Co., Springfield Mass, p. 244.

*Primary Examiner*—Richard Bueker
*Attorney, Agent, or Firm*—Fitzpatrick, Cella, Harper & Scinto

[57] ABSTRACT

In a microwave plasma chemical vapor deposition apparatus for forming a functional deposited film on a substrate which comprises a substantially enclosed film-forming chamber comprising a circumferential wall having an end portion thereof hermetically provided with a microwave introducing window to which a waveguide extending from a microwave power source is connected, said film-forming chamber having a discharge space for causing plasma discharge of resulting in forming a deposited film on a substrate, said substrate being positioned on a substrate holder arranged in said film-forming chamber and said film-forming chamber being provided with means for supplying a film-forming raw material gas into said discharge space and means for evacuating said film-forming chamber, the improvement which comprises a dielectric sheet being movably placed on the surface of said microwave introducing window situated in said film-forming chamber in a state that said dielectric sheet is face to face contacted with said surface of the microwave introducing window.

6 Claims, 4 Drawing Sheets

MICROWAVE PLASMA CHEMICAL VAPOR DEPOSITION PROCESS USING A MICROWAVE WINDOW AND MOVABLE, DIELECTRIC SHEET

This application is a continuation of application Ser. No. 08/240,390 filed May 10, 1994, now abandoned, which is a continuation of application Ser. No. 07/994,472 filed Dec. 21 1992, now abandoned, which is a continuation of application Ser. No. 07/729,873 filed Jul. 11, 1991, now abandoned, which is a continuation of application Ser. No. 07/458,364 filed Dec. 28, 1989, now abandoned.

FIELD OF THE INVENTION

This invention relates to an improvement in a microwave plasma chemical vapor deposition apparatus (hereinafter referred to as "MW-PCVD apparatus") for the formation of a functional deposited film on a substrate.

More particularly, this invention relates to an improved MW-PCVD apparatus having a microwave introducing window provided with a movable sheet made of a dielectric material which enables one to repeat the formation of a functional deposited film on a substrate by microwave plasma chemical vapor deposition process (hereinafter referred to as "MW-PCVD process") without replacement of said microwave introducing window.

BACKGROUND OF THE INVENTION

There have been proposed a number of amorphous semiconductor deposited films such as amorphous silicon semiconductor deposited films containing hydrogen atoms or/and halogen atoms, amorphous silicon carbide semiconductor deposited films containing hydrogen atoms or/and halogen atoms, amorphous silicon nitride semiconductor deposited films containing hydrogen atoms or/and halogen atoms, amorphous silicon germanide semiconductor deposited films containing hydrogen atoms or/and halogen atoms, amorphous germanium semiconductor deposited films containing hydrogen atoms or/and halogen atoms, etc. which are usable as element members for semiconductor devices, electrophoto-graphic photosensitive devices, image input line sensors, image pickup devices, photovoltaic devices, other various electronic elements and optical elements. Some of these amorphous semiconductor films have been practically used.

For the formation of these amorphous semiconductor films, a plasma CVD method by glow discharge in a reaction gas with the use of a high-frequency (RF) to cause formation of a deposited film on a substrate of glass, quartz, heat-resistant synthetic resin, aluminum, stainless steel, etc. has been evaluated as being the most desirable (this method will be hereinafter referred to as "RF glow discharge decomposition method").

Various apparatus have been proposed for practicing said RF glow discharge decomposition method. However, there are unsolved problems for the RF glow discharge decomposition method that film deposition rate is low; gas utilization efficiency is low; the gas pressure upon forming a deposited film is required to be high and because of this, a raw material gas is liable to polymerize within a vapor phase when fine particles are caused; maintenance of the apparatus is not easy; and the product eventually becomes costly.

In recent years, a MW-PCVD method has been noticed on the industrial scale as a new film-forming method which can eliminate those problems of the RF glow discharge decomposition method and which can be replaced said method.

For instance, a ECR microwave plasma CVD method and an apparatus therefor are disclosed in Journal of Non-Crystal-line Solids, Vol. 77 & 78, 813–816 (1985). Further, in Japanese Unexamined Patent Publication No. 186849/1985, there is disclosed a MW-PCVD apparatus having an internal reaction space formed by a plurality of cylindrical substrates being arranged so as to circumscribe a microwave introducing means which can heighten the utilization efficiency of a raw material gas.

The known MW-PCVD apparatus has such a constitution as shown in a schematic vertical section view of FIG. 4. Referring to FIG. 4, the apparatus comprises a film-forming chamber 401 comprising a circumferential wall having an end portion thereof hermatically provided with a microwave introducing window (microwave transmissive window) 402 made of a dielectric material such as alumina ceramics, quartz, etc. to which a waveguide 403 extending from a microwave power source 411 through an isolator (not shown) is connected, a microwave power meter 410 and a stub tuner 409. The film-forming chamber 401 has a discharge space (reaction space) 406 and a plurality of rotatable cylindrical substrate holders 407 therein. On each of said substrate holders 407, there is placed a cylindrical substrate 405 on which a film is to be formed. Said plurality of rotatable cylindrical substrate holders 407 are concentrically arranged in the film-forming chamber 401 so as to circumscribe the discharge space 406. Each of the rotatable cylindrical substrate holders 407 contains an electric heater 407' for heating the substrate 405 placed thereon. Each of the rotatable cylindrical substrate holders 407 is supported by a rotary shaft 408 connected to a drive motor (not shown). Numeral reference 404 stands for an exhaust pipe for evacuating the film-forming chamber which is connected through a main vacuum valve (not shown) to a vacuum pump (not shown). The film-forming chamber 401 is provided with means for supplying a film-forming raw material gas into the film-forming chamber 401 (not shown).

The film-forming chamber 401 is so designed as to start discharge by self-exciting discharge without using a discharge trigger or the like, and it has a cavity resonator structure capable of resonating with an oscillation frequency of a microwave power source.

The formation of a deposited film by using the apparatus shown in FIG. 4 is carried out as follows.

The inside of the film-forming chamber 401 is evacuated through the exhaust pipe 404, and the heater 407' is actuated to heat each of the substrates 405 to a predetermined temperature and it is maintained at this temperature. Concurrently, the substrates 405 are rotated by the drive motors respectively at a desired constant speed. Then, in the case of forming an amorphous silicon deposited film, raw material gases such as silane gas and hydrogen gas are fed through the gas supply means into the film-forming chamber 401. At the same time, a microwave having a frequency of 500 MHz or more, preferably, 2.45 GHz is caused from the microwave power source 411. The microwave is supplied through the waveguide 403 and the microwave introducing window 402 into the film-forming chamber 401. Thus, the raw material gases thus introduced into the film-forming chamber 401 are excited and decomposed with the action the microwave energy to cause neutral radicals, ions, electrons, etc. Then, these are reacted with each other to form a deposited film on each of the substrates 405.

For the conventional MW-PCVD apparatus, there are problems that films are unavoidably deposited on the surface of the microwave introducing window 402 which is situated in the film-forming chamber as film formation proceeds, and along with this the quantity of a microwave energy applied into the film-forming chamber is gradually changed to cause negative effects such as insufficient decomposition of a raw material gas, reduction in the film deposition rate, reduction in the utilization efficiency of the raw material gas, etc. In addition, said films deposited on the surface of the microwave introducing window are sometimes removed in fine particles which get into a film to be deposited on the substrate and as a result, the resulting film becomes such that is accompanied with defects. In order to avoid occurrence of these problems, it is required to periodically clean the microwave introducing window or to periodically replace it by a new one. In this connection, the product unavoidably becomes costly.

Particularly, in the case of preparing an electrophotographic photosensitive device, since its light receiving layer is usually such that has a thickness of, for example, 20 to 40 μm, it takes a long period of time for the formation thereof even at a high deposition rate in any case. Because of this, a relatively large amount of films is deposited on the surface of the microwave introduced during the film forming process and the quantity of a microwave energy applied is changed accordingly. In the case when the film-forming process is repeated. As a result, the resulting layer assumes to have such electric characteristics as varied in the thickness direction. Further in the above case, the microwave introducing window is markedly heated because, in addition to receiving a radiant heat caused by plasma generated in the discharge space, absorption of microwave by said films deposited on the surface of the microwave introducing window, when said films are accordingly heated. This situation is less problematic when said films are thin. But it is problematic when they are thick since the quantity of microwave absorbed by them becomes significantly large and said films are heated to an elevated temperature to case phase change such as crystallization within them. In this case, the quantity of a microwave energy to be applied into the film-forming chamber is largely varied to make the state of discharge to be caused in the discharge space unstable and as a result, as above described, the resulting layer becomes such that is accompanied with defects. In addition, the microwave introducing window is sometimes damaged because of being overheated.

In view of the above, there is an increased demand to make an effective improvement to eliminate the foregoing problems on the conventional MW-PCVD apparatus and to provide a desirable MW-PCVD apparatus which enables one to stably and repeatedly produce a functional deposited film while utilizing various advantages of the MW-PCVD film-forming method.

SUMMARY OF THE INVENTION

This invention is aimed at eliminating the foregoing problems in the conventional apparatus for the formation of a deposited film using MW-PCVD process and providing an improved apparatus for practicing MW-PCVD process which meets the foregoing demand and which enables one to stably and repeatedly form a desirable functional deposited film which is usable as an element member for semiconductor devices, photosensitive devices for use in electrophotography, image reading line sensors, image pickup devices, photoelectromotive members, or other electronic and optical devices at a high deposition rate.

Another object of this invention is to provide an improved apparatus for forming a functional deposited film using MW-PCVD process which enables one to stably and repeatedly form a desirable functional deposited film of excellent quality even in the case of forming a relatively thick film at a high deposition rate on a large square substrate, for example, for a photosensitive member for use in electrophotography.

A further object of this invention is to provide an improved apparatus for practicing the MW-PCVD process which enables one to mass-produce a desirable functional deposited film having a wealth of excellent electric, optical and photoconductive characteristics.

A still further object of this invention is to provide an improved apparatus for practicing the MW-PCVD process which is provided with an improved microwave introducing window which is not damaged even upon repeating the MW-PCVD process for a long period of time.

The present inventors have made earnest studies for overcoming the foregoing problems on the known apparatus for forming a functional deposited film using MW-PCVD process and attaining the objects of this invention as described above and as a result, the present inventors have determined that such problems on the known apparatus for forming a functional deposited film using MW-PCVD process can be overcome by providing a slidably movable sheet made of a dielectric material for the microwave introducing window.

Therefore, the principal feature of this invention is directed to an improvement in the known apparatus for the formation of a functional deposited film on a substrate by means of a microwave plasma CVD process which comprises a substantially enclosed film-forming chamber, a means for supporting a substrate on which a functional deposited film is to be deposited, a means for supplying raw material gases, a means for evacuating said film-forming chamber and a means for generating microwave discharge plasmas in said film-forming chamber, the improvement comprises having a slidably movable sheet made of dielectric material for the surface of the microwave introducing window which is situated in the film-forming chamber.

Another feature of this invention is directed to an improvement in the known apparatus for the formation of a functional deposited film on a plurality of substrates by means of a MW-PCVD process which comprises a substantially enclosed film-forming chamber comprising a circumferential wall having an end portion thereof hermetically provided with a microwave introducing window to which a waveguide extending from a microwave power source is connected, said film-forming chamber having a discharge space and a plurality of rotatable cylindrical substrate holders therein, each of said substrate holders being capable of having one of said substrates positioned thereon, said substrate holders being concentrically arranged in said film-forming chamber so as to circumscribe said discharge space, said film-forming chamber being provided with means for supplying a film forming raw material gas into said discharge space and means for evacuating said film-forming chamber, the improvement comprises having a slidably movable sheet made of a dielectric material for the surface of the microwave introducing window which is situated in the film-forming chamber.

DESCRIPTION OF THE PREFERRED EMBODIMENTS OF THE INVENTION

Representative embodiments of an improved MW-PCVD apparatus according to this invention will now be explained in detail with reference to the drawings. The description is not intended to limit the scope of this invention.

There is shown a typical embodiment of the MW-PCVD apparatus according to this invention in FIGS. 1 and 2 which has basically the same constitution as that of the foregoing known MW-PCVD apparatus shown in FIG. 4, except that the former is provided with a mechanism for slidably moving a sheet made of a dielectric material (this sheet will be hereinafter referred to as "dielectric sheet") in close proximity to the surface of microwave introducing window which is situated in the film-forming chamber.

Figure 1:
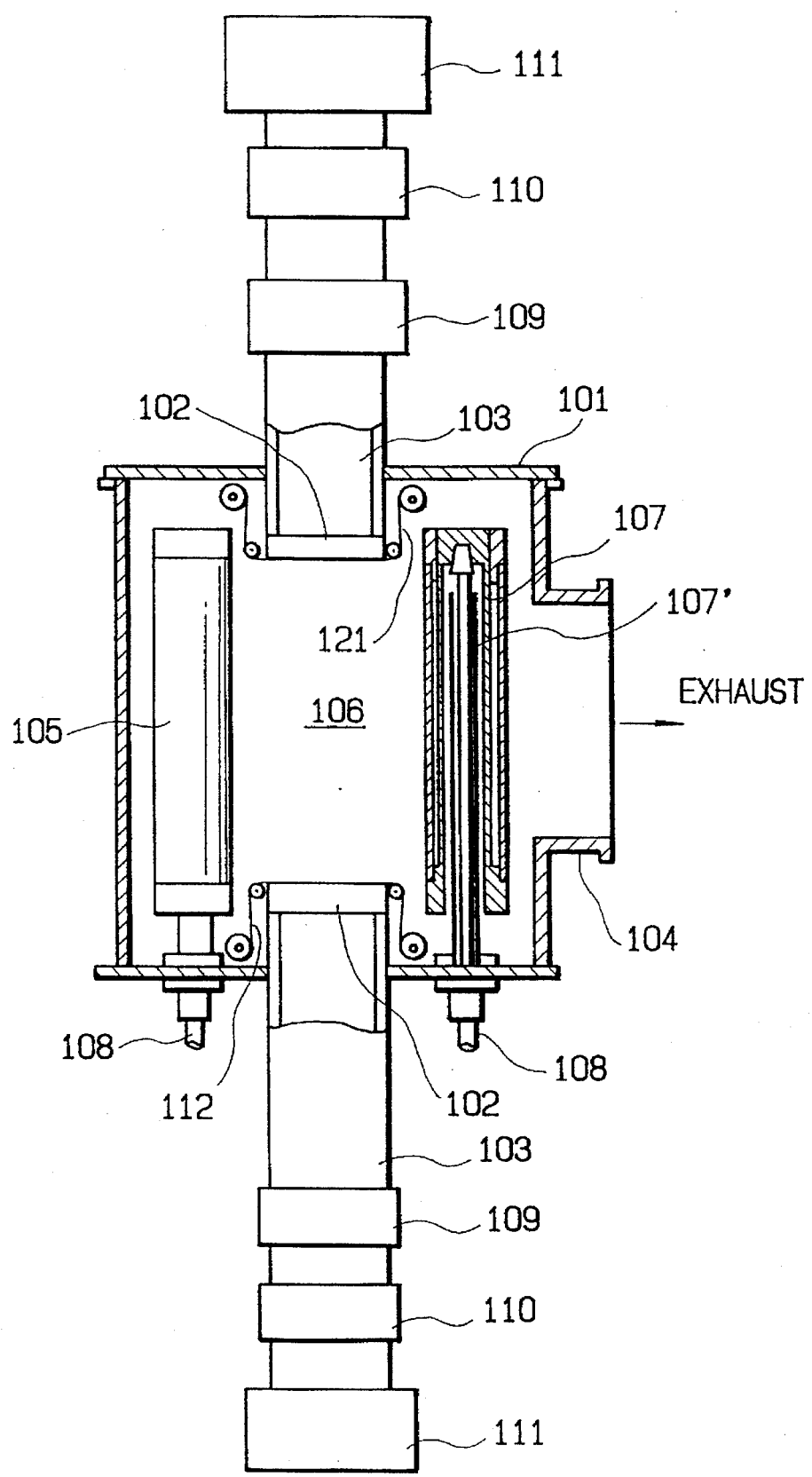
FIG. 1 is a schematic vertical sectional view of a preferred embodiment of the MW-PCVD apparatus for forming a functional deposited film according to this invention.
Figure 2:
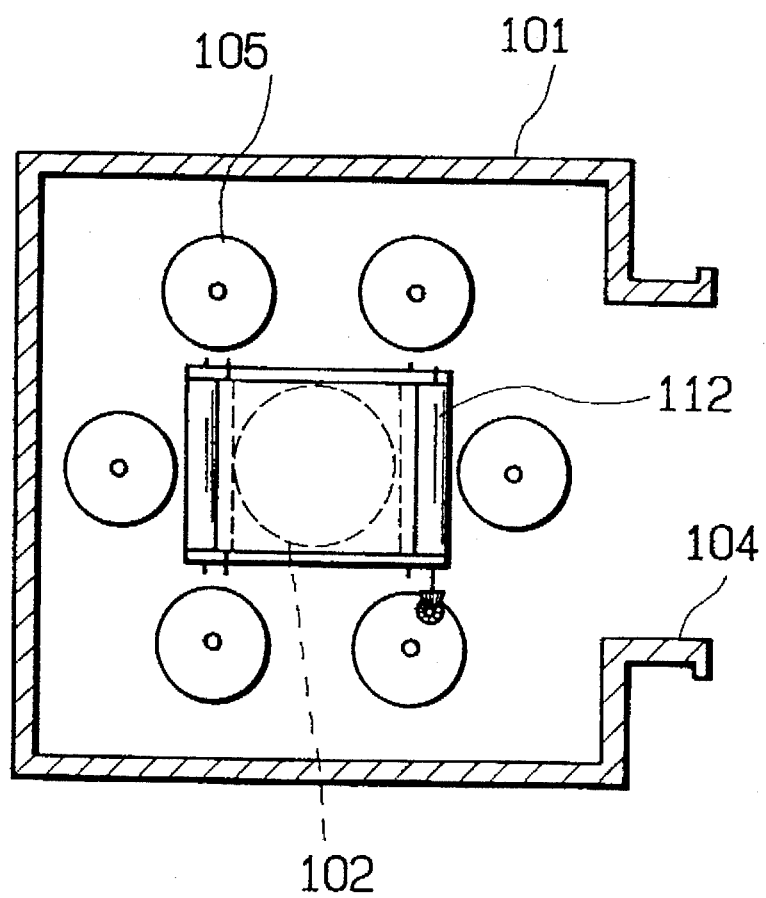
FIG. 2 is a schematic cross sectional view of the MW-PCVD apparatus shown in FIG. 1.

That is, the MW-PCVD apparatus shown in FIGS. 1 and 2 comprises a substantially enclosed film-forming chamber 101 comprising a circumferential wall having an end portion thereof hermetically provided with a microwave introducing window 102 made of a dielectric material such as alumina ceramics, quartz, etc. to which a waveguide 103 extending from a microwave power source 111 through an isolator (not shown), a microwave power meter 110 and a stub tuner 109 is connected. The film-forming chamber has a discharge space 106 which is circumscribed by a plurality of rotatable cylindrical substrate holders 107 being concentrically arranged. Each of said cylindrical substrate holders 107 has a substrate 105 thereon on which a film is to be deposited.

Each of the rotatable cylindrical substrate holders 107 contains an electric heater 107' for heating the substrate 105 placed thereon. Each of the rotatable cylindrical substrate holders 107 is supported by a rotary shaft connected to a drive motor (not shown). The film-forming chamber 101 is provided with an exhaust pipe 104 for evacuating the film-forming chamber, said exhaust pipe being connected through a vacuum valve (not shown) to a vacuum pump (not shown).

The film-forming chamber 101 is provided with a means for supplying a film-forming raw material gas (not shown) into the discharge space 106. In a preferred embodiment, said means for supplying a film-forming raw material gas comprises one or more gas supply pipes extending from gas reservoirs. And the gas feed pipe is provided with a plurality of gas liberation nozzles capable of uniformly supplying the film-forming raw material gas toward the discharge space 106. It is desired for the gas feed pipe to be longitudinally installed in the space between the adjacent cylindrical substrate holders 107.

Numeral reference 121 stands for a mechanism for slidably moving the dielectric sheet while it is face to face contacted with the surface of the microwave introducing window 102 which is situated in the film-forming chamber 101. As said dielectric sheet, there can be mentioned, for example, a so-called ceramic paper made of ceramics containing aluminum oxide or/and silicon oxide as the main ingredient or a glass fiber sheet impregnated with a proper metal oxide. As for the thickness of the dielectric sheet 121, it is desired to be in the range of 0.1 to 1 mm from the viewpoints that mechanical strengths such as tensile strength become insufficient when it is too thin and on the other hand, when it is too thick, the sheet cannot be easily bended.

As for the size of the dielectric sheet, there is not any particular restriction therefor and therefore, any size can be employed as long as the surface of the microwave introducing window 102 situated in the film-forming chamber 101 can be entirely covered thereby. In any case, it is properly decided depending upon the shape or/and the constitution of the microwave introducing window 102 to be used.

Figure 3:
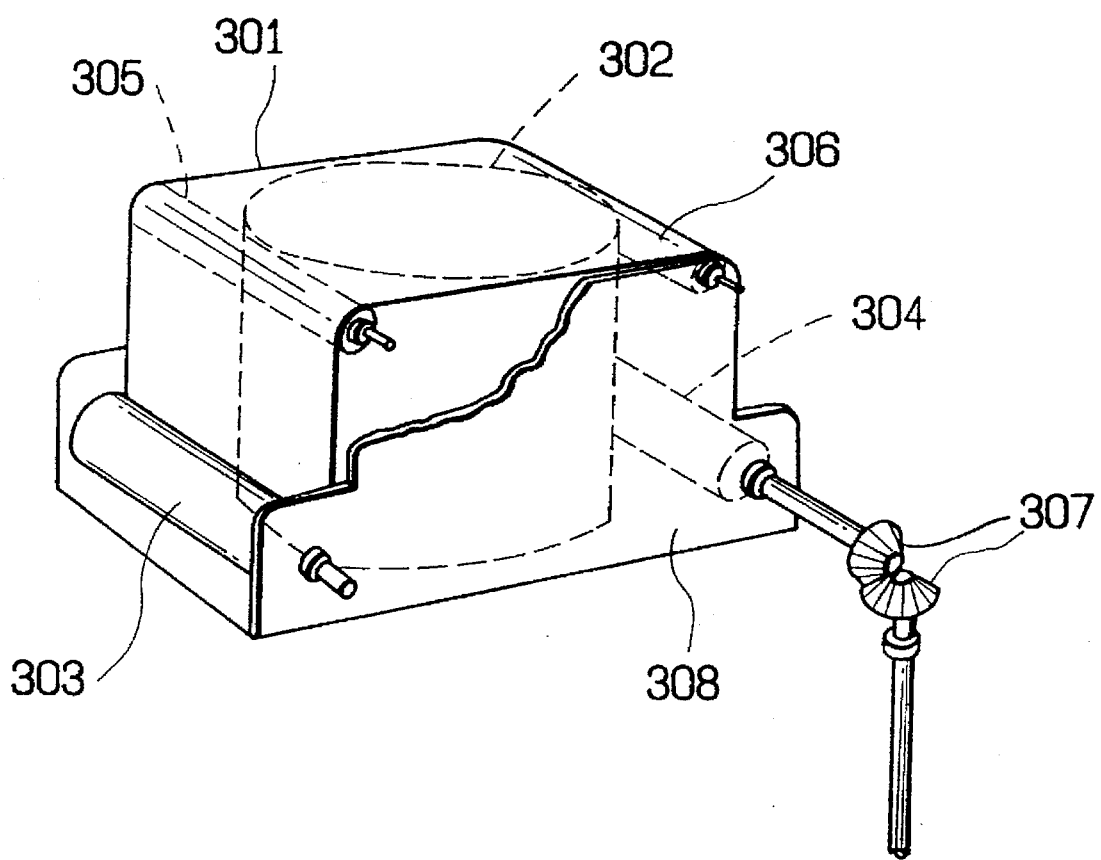
FIG. 3 is a schematic explanatory view of a mechanism for transporting moving a movable sheet made of a dielectric material provided for the microwave introducing window of the MW-PCVD apparatus shown in FIG. 1.

FIG. 3 schematically shows a preferred embodiment of the dielectric sheet-moving mechanism 121 in FIGS. 1 and 2. The dielectric sheet-moving mechanism shown in FIG. 3 comprises a chassis 308 including a feed roller 303 for feeding the foregoing dielectric sheet 301, a guide roller 302 positioned on the side where the feed roller 303 is situated, another guide roller 306 positioned on the side where a take-up roller 304 to take-up said dielectric sheet is situated, said take-up roller 304 having a rotary shaft connected through a pair of gears 307 to a drive motor (not shown). The dielectric sheet 301 fed by the feed roller 303 is guided by the guide rollers 305 and 306 and taken up by the take-up roller 304 such that it is moved while being face to face contacted with the surface of a microwave introducing window 302 situated in the film-forming chamber (not shown).

Any of the feed roller 303, the guide rollers 305 and 306, the take-up roller 304, and the chassis 308 is made of a material having a mechanical strength as required and being capable of vacuum-sealing the system. Examples of such material are metals such as nickel and alloys such as stainless steel.

The dielectric sheet-moving mechanism to be employed in the MW-PCVD apparatus according to this invention is not limited to the constitution shown in FIG. 3 and may have any other constitution as long as it permits the dielectric sheet to move in a state of being face to face contact with the surface of the microwave introducing window situated in the film-forming chamber. For instance, the dielectric sheet-moving mechanism may be of such constitution that a feed roller of feeding a dielectric sheet and a take-up roller of taking up said dielectric sheet are positioned outside of the film-forming chamber, the dielectric sheet is fed from the feed roller through a vacuum sealing means into the film-forming chamber and it is taken out through a vacuum sealing means by the take-up roller while making it to be face to face contacted with the surface of the microwave introducing window.

The formation of a deposited film by using the MW-PCVD apparatus according to this invention which is shown in FIGS. 1 and 2 and which has the electric sheet-moving mechanism shown in FIG. 3 is carried out, for example, as follows.

Firstly, a cylindrical substrate 105 is positioned on each of the cylindrical substrate holders 107 in the film-forming chamber 101. Then, the inside of the film-forming chamber 101 is evacuated through the exhaust pipe 104, and each of the heaters 107' is actuated to heat each of the cylindrical substrates 105 to a predetermined temperature and it is maintained at this temperature. Concurrently, each of the cylindrical substrates 105 is rotated at a desired constant speed. Then, for example, in the case of forming an amorphous silicon deposited film, silane gas ($SiH_4$ gas) and hydrogen gas ($H_2$ gas) are supplied, for example, through the gas feed pipe as explained above into the discharge space 106 of the film-forming chamber 101 at predetermined respective flow rates. The gas pressure in the film-forming chamber 101 is controlled to a predetermined value by regulating the vacuum valve. The microwave power source 111 is switched on to apply a microwave energy of a predetermined power into the discharge space 106 by adjusting the stub tuner 109 while observing the reading on the microwave power meter 110, to thereby cause plasma discharge in the discharge space 106 and form an amorphous silicon deposited film on each of the cylindrical substrates 105.

In the above procedures, at the same time when said microwave energy is applied into the discharge space 106, the dielectric sheet-moving mechanism starts operating to feed the dielectric sheet 301 from the feed roller 303 and take up it by the take-up roller 304 at a predetermined moving speed by actuating the drive motor in a state that the dielectric sheet 301 is secured to be always face to face contacted with the surface of the microwave introducing window 102 which is situated in the film-forming chamber 101 such that said surface is always entirely covered by said dielectric sheet. In this case, the turning force generated by the drive motor is transferred to the gears 307 by which the take-up roller 304 is rotated to take up the dielectric sheet 301 as transported while it is fed from the feed roller 303 and slidably moving on the surface of the microwave introducing window 302.

Thus, the surface of the microwave introducing window is always maintained as being covered by the dielectric sheet and because of this, it is always prevented from contacting with discharge plasma generated in the film-forming chamber and there is not any occasion for the surface of the microwave introducing window to have deposition of films thereon as found in the case of the know MW-PCVD apparatus. In stead, a films is deposited on the surface of the dielectric sheet but the sheet having the film deposited thereon is replaced by a new one before its thickness becomes thick. In this connection, the foregoing problems found on the known MW-PCVD apparatus do not occur in the MW-PCVD apparatus according to this invention.

As a result, any of the foregoing amorphous silicon films deposited on each of the cylindrical substrates 105 becomes such that excels in the quality without accompaniment of any defects caused by contamination of fine particles from the films deposited on the surface of the microwave introducing window which is often found in the case of the known MW-PCVD apparatus, is uniform in the characteristics and has an uniform thickness.

It is desired for the dielectric sheet to be transported in a state of being face to face contacted close as much as possible to the surface of the microwave introducing window.

In the case where a large allowance exists between the dielectric sheet and the surface of the microwave introducing window, absorption of a microwave energy is caused in said allowance and this leads to undesirably changing the stage of plasma discharge in the film-forming chamber. In view of this, it is necessary for the dielectric sheet-moving mechanism to be so designed as to have a sufficient precision. And the surface of the dielectric sheet to be faced to the surface of the microwave introducing window is desired to have a polished even surface.

The speed of winding up the dielectric sheet by the take-up roller is properly decided depending upon the deposition rate of a deposited film to be formed. For example, in the case of forming an amorphous silicon deposited film, it is desired to move the dielectric sheet at such a speed that the thickness of a film deposited on the dielectric sheet becomes less than 50 μm for the reason that when said thickness exceeds 50 μm, the film is likely to crystalize.

The foregoing various advantages of this invention will become more clear from the results obtained in the following Experiment 1, Comparative Experiment 1, Example 1 and Comparative Example 1.

Experiment 1 and Comparative Experiment 1

(Experiment 1)

Using the MW-PCVD apparatus shown in FIGS. 1 and 2 which has the dielectric sheet-moving mechanism shown in FIG. 3, the foregoing film-forming procedures were repeated under the conditions shown in the column of Experiment 1 of Table 1, to thereby conduct discharge test. This test was repeated five times.

(Comparative Experiment 1)

Figure 4:
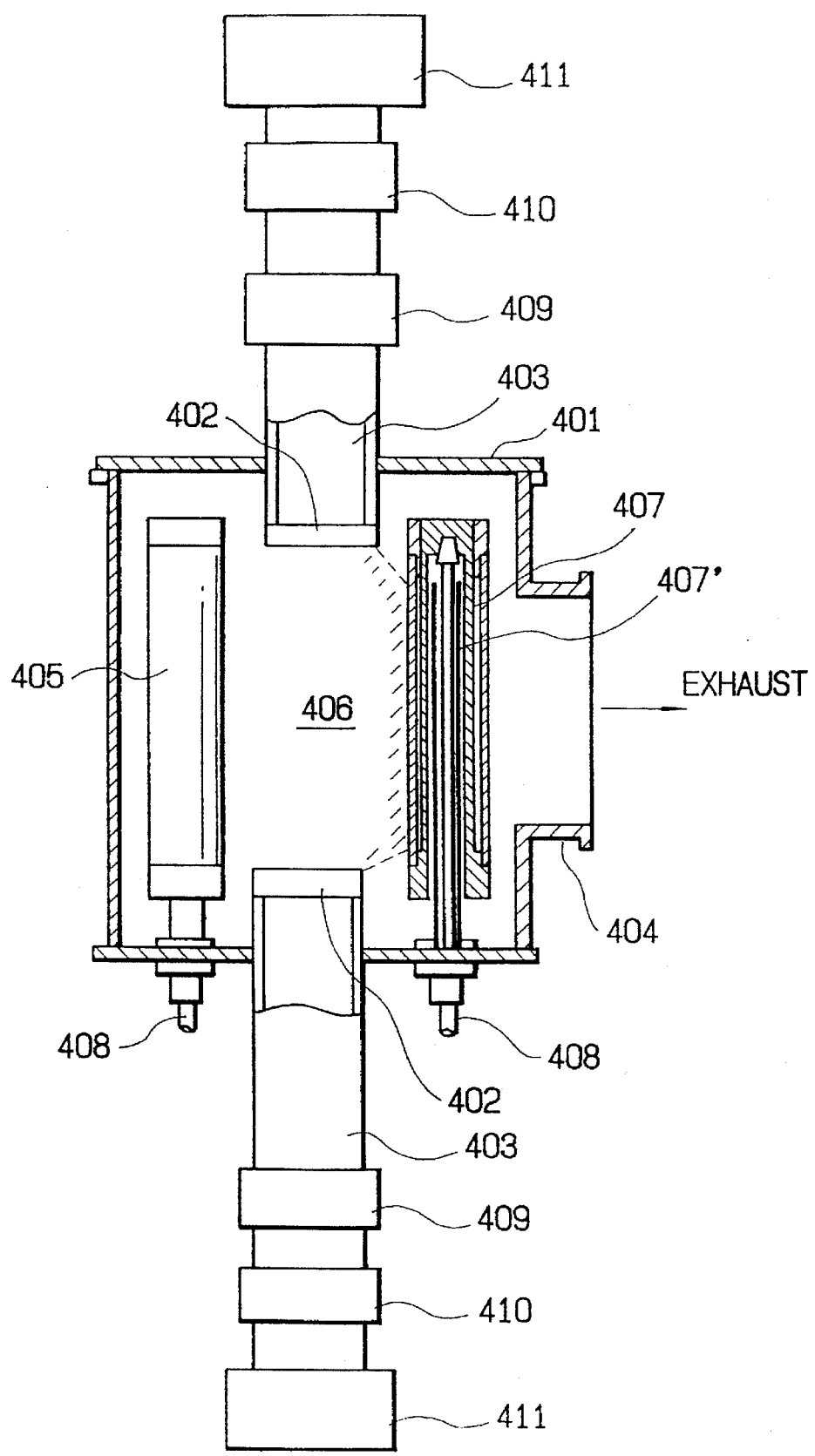
FIG. 4 is a schematic vertical sectional view of the known MW-PCVD apparatus.

Using the known MW-PCVD apparatus shown in FIG. 4 which does not have any dielectric sheet-moving mechanism, the foregoing film-forming procedures using said known MW-PCVD apparatus were repeated under the conditions shown in the column of Comparative Experiment 1 of Table 1, to thereby conduct discharge test. This test was repeated five times.

Evaluation

Evaluation by the discharge test was conducted in order to find out the time when the gas pressure (inner pressure) of the film-forming chamber is largely changed due to occurrence of a crack on the microwave introducing window.

The results obtained in Experiment 1 and the results obtained in Comparative Experiment 1 were collectively shown in Table 2.

As Table 2 illustrates, it is recognized that the microwave introducing window is not damaged and remained stable even upon repeating the film-forming process for a long period of time in the case of the MW-PCVD apparatus according to this invention. On the other hand, in the case of the known MW-PCVD apparatus, the microwave introducing window is unavoidably damaged within a period of 126 to 173 minutes since the start of the film-forming process.

Example 1 and Comparative Example 1

(Example 1)

Using the MW-PCVD apparatus shown in FIGS. 1 and 2 which has the dielectric sheet-moving mechanism shown in FIG. 3, there were prepared sixty electrophotographic photosensitive drum samples each comprising a cylindrical aluminum substrate and a light receiving layer disposed on said substrate which comprises a charge injection inhibition layer, a photoconductive layer and a surface layer, by repeating the foregoing film-forming procedures under the conditions shown in Table 3 and also in Table 4.

(Comparative Example 1)

Using the known MW-PCVD apparatus shown in FIG. 4 which does not have any dielectric sheet-moving mechanism, there were prepared sixty electrophotographic photosensitive drum samples each comprising a cylindrical aluminum substrate and a light receiving layer disposed on said substrate which comprises a charge injection inhibition layer, a photoconductive layer and a surface layer, by repeating the foregoing film-forming procedures using the known MW-PCVD apparatus under the conditions shown in Table 3.

Evaluations

Each of the electrophotographic photosensitive drum samples obtained in Example 1 and Comparative Example 1 was set to a modification of a commercially available CANON NP 7550 Electrophotographic Copying Machine for use in evaluation purposes to evaluate dispersion of charge retentivity, dispersion of photosensitivity and appearance of defective image in the following manners.

Dispersion of Charge Retentivity

For each of the sixty electrophotographic photosensitive drum samples obtained in Example 1 and also for each of the sixty electrophotographic photosensitive drum samples obtained in Comparative Example 1, the surface potential under dark at the center of the drum sample was measured under a constant corona current. And there was obtained a difference between the maximum value and the minimum value from the results obtained for each of Example 1 and Comparative Example 1.

Dispersion of Photosensitivity

For each of the sixty electrophotographic photosensitive drum samples obtained in Example 1 and also for each of the sixty electrophotographic photosensitive drum samples obtained in Comparative Example 1, after being corona charged in the same manner as in the above case, it was irradiated with visible light in a constant exposure quantity to measure a change in the surface potential. And there was obtained a difference between the maximum value and the minimum value with respect to the quantity changed for each of Example 1 and Comparative Example 1.

Defective Image

For each of the sixty electrophotographic photosensitive drum samples obtained in Example 1 and also for each of the sixty electrophotographic photosensitive drum samples obtained in Comparative Example 1, the image-forming process was conducted to reproduce images on a A-3 size paper by using a whole black original. The images obtained were examined by eyes and the number of blank areas of more than 0.3 mm in diameter was counted.

And there was obtained an average value of the blank areas per one drum sample for each of Example 1 and Comparative Example 1.

The results obtained were collectively shown in Table 5.

From the results shown in Table 5, it has been recognized that the MW-PCVD apparatus according to this invention is surpassing the known MW-PCVD apparatus and a desirable functional deposited film can be stably and repeatedly obtained by the MW-PCVD apparatus according to this invention.

TABLE 1

|  | Experiment 1 | Comparative Experiment 1 |
| --- | --- | --- |
| gas used | $SiH_4$ | $SiH_4$ |
| flow rate(sccm) | 500 | 500 |
| gas pressure (mTorr) | 5 | 5 |
| microwave frequency (GHz) | 2.45 | 2.45 |
| microwave power (kW) | 1 | 1 |
| substrate | aluminum cylinder of 108 mm in outer diameter | aluminum cylinder of 108 mm in outer diameter |
| conditions for moving dielectric sheet |  |  |
| sheet material | alumina ceramic paper |  |
| sheet size | width: 200 mm thickness: 0.5 mm length: 3 m |  |
| moving speed | 5 mm/min |  |

TABLE 2

| the number of times of the test | 1st time | 2nd time | 3rd time | 4th time | 5th time |
| --- | --- | --- | --- | --- | --- |
| the period of time until the window became damaged (minutes) Experiment 1 | the window was not damaged during discharge for 5 hours | | | | |
| Comparative Experiment 1 | 142 | 126 | 173 | 155 | 138 |

TABLE 3

|  | charge injection inhibition layer | | photoconductive layer | | surface layer | |
| --- | --- | --- | --- | --- | --- | --- |
| gas used and flow rate(sccm) | $SiH_4$ $B_2H_6$ | 200 1000 ppm (against the flow rate of $SiH_4$) | $SiH_4$ | 500 | $SiH_4$ $CH_4$ | 50 400 |
| gas pressure (mTorr) | 3 | | 5 | | 5 | |
| microwave frequency (GHz) | 2.45 | | 2.45 | | 2.45 | |
| microwave power (kW) | 0.5 | | 1 | | 0.5 | |
| discharged period (min) | 25 | | 110 | | 10 | |
| layer thickness(μm) | 3 | | 27 | | 0.5 | |

TABLE 4

| conditions for moving a dielectric sheet in Example 1 | sheet material | glass wool sheet impregnated with alumina powder |
| --- | --- | --- |
| | sheet size | width: 200 mm, thickness: 0.8 mm, length: 3 m |
| | moving speed | 20 mm/min |

TABLE 5

|  | dispersion of charge retentivity*[1] | dispersion of photosensitivity*[1] | defective image*[2] |
| --- | --- | --- | --- |
| Example 1 (relative value to the control) | 0.4 | 0.3 | 0.3 |
| Comparative Example 1 (control value) | 1 | 1 | 1 |

*[1] the range of the dispersion obtained in Comparative Example 1 was made to be the contorol (1).
*[2] the average value of the number of defective images of more than 0.3 mm in diameter in Comparative Example 1 was made to be the control(1).

What we claim is:

1. An improved microwave plasma chemical vapor deposition process for forming a deposited film on a plurality of cylindrical substrates arranged in a substantially enclosed film-forming chamber having a discharge space, said film-forming chamber comprising a circumferential wall having an end portion thereof hermetically provided with a microwave introducing window formed of a dielectric material to which a waveguide extending from a microwave power source is connected, said microwave introducing window being protected into said film-forming chamber and having a surface exposed into said discharge space, said film-forming chamber containing a plurality of rotatable cylindrical substrate holders circumferentially positioned around a longitudinal axis of said discharge space, each of said rotatable cylindrical substrate holders being provided with an electric heater therein, each of said rotatable cylindrical substrate holders having one of said plurality of cylindrical substrates mounted thereon, said rotatable cylindrical substrate holders being arranged at a desired interval, said film-forming chamber being further provided with means for supplying a film-forming raw material gas into said discharge space and means for evacuating said film-forming chamber, wherein said film-forming chamber is further provided with a sheet moving mechanism comprising:

(a) a feed roller for delivering a 0.1 to 1 mm thick dielectric sheet comprised of a member selected from the group consisting of ceramic papers made of ceramics containing aluminum oxide as the main ingredient, ceramic papers made of ceramics containing silicon oxide as the main ingredient, ceramic papers containing silicon oxide and aluminum oxide as the main ingredients, and glass fiber sheets impregnated with a metal oxide, said dielectric sheet having a first surface in direct physical contact with said surface of said microwave introducing window, and a second surface exposed to said discharge space;

(b) guide roller means for conveying and supporting said dielectric sheet delivered from said feed roller, said guide roller means being arranged outside said microwave introducing window projected into said film-forming chamber such that said guide roller means are opposed to each other through said microwave introducing window, said guide roller means being capable of conveying said dielectric sheet while supporting said dielectric sheet such that said first surface of said dielectric sheet is in direct physical contact with said surface of said microwave introducing window; and (c) means for moving said dielectric sheet from said feed roller while said first surface of said dielectric sheet is in direct physical contact with said surface of said microwave introducing window within said film-forming chamber in the vicinity of said discharge space, and while said dielectric sheet is being supported by said guide roller means, said microwave plasma chemical vapor deposition process comprising:

introducing a film-forming raw material gas for forming said deposited film into said discharge space through said film-forming raw material gas supplying means, and simultaneously introducing a microwave energy into said discharge space through said microwave introducing window to generate plasma in said discharge space while rotating each of said plurality of cylindrical substrates, while further operating said sheet moving mechanism so that said dielectric sheet is moved at such a speed that the thickness of a film deposited on said second surface of said dielectric sheet is less than 50 um, and while said first surface of said dielectric sheet is in direct physical contact with said surface of said microwave introducing window such that said surface of said microwave introducing window is entirely covered by said dielectric sheet whereby causing the formation of said deposited film on each of said plurality of cylindrical substrates, while each is maintained at a desired temperature.

2. The microwave plasma chemical vapor deposition process according to claim 1, wherein the film deposited on each of the cylindrical substrates is an amorphous silicon.

3. The microwave plasma chemical vapor deposition process according to claim 2, wherein the product comprising the amorphous silicon film formed on each of the cylindrical substrates is an electrophotographic photosensitive drum.

4. The microwave plasma chemical vapor deposition process according to claim 2, wherein the amorphous silicon film deposited on each of the cylindrical substrates is a photoconductive film.

5. A microwave plasma chemical vapor deposition process for forming a deposited film on a substrate arranged in a substantially enclosed film-forming chamber having a discharge space such that said substrate is exposed in said discharge space, said process comprising:

(a) introducing a film-forming raw material gas for forming said deposited film into said discharge space through a film-forming raw material gas supplying means and simultaneously introducing a microwave energy into said discharge space through a microwave introducing window which is projected into said film-forming chamber and has a surface exposed into said discharge space to generate plasma thereby causing the formation of said deposited film on said substrate maintained at a desired temperature; and (b) employing a sheet moving mechanism comprising a moving dielectric sheet and guide roller means for supporting and conveying said dielectric sheet arranged outside said microwave introducing window projected into said film-forming chamber such that said guide roller means are opposed to each other through said microwave introducing window, said dielectric sheet comprising a member selected from the group consisting of ceramic papers made of ceramics containing aluminum oxide as the main ingredient, ceramic papers made of ceramics containing silicon oxide as the main ingredient, ceramic papers containing silicon oxide and aluminum oxide as the main ingredients, and glass fiber sheets impregnated with a metal oxide, said dielectric sheet having a first surface in direct physical contact with said surface of said microwave introducing window, and having a second surface to be exposed to said discharge space, wherein said dielectric sheet is supported by said guide roller means such that said first surface of said dielectric sheet is in direct physical contact with said surface of said microwave introducing window and said dielectric sheet is conveyed by said guide roller means while said first surface is in direct physical contact with said surface of said microwave introducing window within said film-forming chamber in the vicinity of said discharge space.

6. The microwave plasma chemical vapor deposition process according to claim 5, including employing said dielectric sheet having a thickness of 0.1 to 1 mm.

* * * * *

UNITED STATES PATENT AND TRADEMARK OFFICE
CERTIFICATE OF CORRECTION

PATENT NO. : 5,637,358

DATED : June 10, 1997

INVENTOR(S) : HIROKAZU OHTOSHI ET AL.

It is certified that error appears in the above-identified patent and that said Letters Patent is hereby corrected as shown below:

On the title page, item:

[75] INVENTORS

"Hirokazu Otoshi" should read --Hirokazu Ohtoshi--.

COLUMN 3

Line 2, "this" should read --this,--.

COLUMN 7

Line 40, "becomes" should be deleted.
Line 41, "such that" should be deleted.

COLUMN 10

Line 63, "protected" should read --projected--.

Signed and Sealed this

Thirtieth Day of December, 1997

Attest:

BRUCE LEHMAN

*Attesting Officer*   *Commissioner of Patents and Trademarks*